United States Patent [19]

Schirmer

[11] Patent Number: 5,208,728
[45] Date of Patent: May 4, 1993

[54] HOUSING FOR FITTING IN MOTOR VEHICLES TO HOLD ELECTRONIC COMPONENTS

[75] Inventor: Klaus Schirmer, Ingolstadt, Fed. Rep. of Germany

[73] Assignee: Telefunken electronic GmbH, Heilbronn, Fed. Rep. of Germany

[21] Appl. No.: 857,948

[22] Filed: Mar. 26, 1992

[30] Foreign Application Priority Data

Apr. 12, 1991 [DE] Fed. Rep. of Germany ....... 4112022

[51] Int. Cl.$^5$ .............................................. H02B 1/00
[52] U.S. Cl. .................................. 361/380; 174/52.3; 361/394; 361/399; 361/388
[58] Field of Search .................... 174/35 R, 52.2, 52.3, 174/50.5; 361/386–389, 392, 394, 395, 399, 424, 380

[56] References Cited

U.S. PATENT DOCUMENTS

| | | | |
|---|---|---|---|
| 3,616,533 | 11/1971 | Heap et al. | 361/387 |
| 4,072,378 | 2/1978 | Lockbrunner et al. | 361/388 |
| 4,546,412 | 10/1985 | Nakazawa et al. | 361/395 |
| 5,102,712 | 4/1992 | Peirce et al. | 361/380 |

FOREIGN PATENT DOCUMENTS

| | | |
|---|---|---|
| 0113073 | 6/1983 | European Pat. Off. . |
| 0407072 | 1/1991 | European Pat. Off. ............ 361/424 |
| 2347250 | 8/1974 | Fed. Rep. of Germany . |
| 3602245A1 | 8/1987 | Fed. Rep. of Germany . |
| 1258488 | 12/1971 | United Kingdom ................ 361/388 |

Primary Examiner—Gregory D. Thompson
Attorney, Agent, or Firm—Spencer, Frank & Schneider

[57] ABSTRACT

To make housings used in automotive engineering for holding electronic components suitable for engine compartment installation, complex measures are taken that involve high manufacturing costs. In accordance with the invention, a housing is provided that permits simple production at low cost and affords dependable protection of the electronic systems, in that the electronic components mounted on an electronic carrier are provided with a protective lacquer, and then covered with a flexible and watertight foil as a protection against moisture in such a way that it provides an airtight and watertight seal on an all-round edge formed by a metal plate supporting the electronic carrier. A housing cover forming the housing in conjunction with the metal plate serves as a mechanical protection.

18 Claims, 1 Drawing Sheet

HOUSING FOR FITTING IN MOTOR VEHICLES TO HOLD ELECTRONIC COMPONENTS

BACKGROUND OF THE INVENTION

The invention relates to a housing for fitting in motor vehicles to hold electronic components, with the electronic components being disposed on an electronic carrier, in particular a PCB, a film or a hybrid carrier.

Electronic control and regulating systems are being used increasingly in motor vehicles, the components of which are accommodated in housings to protect them from the stresses and interference occurring in operation. These housings are constructed either partially or completely of metal in order to suppress electromagnetic interference (EMV interference). A housing of this type at the same time serves to dissipate the heat from the electrical power loss, with cooling fins, for example, being used in addition to achieve this at an ambient temperature of between $-40°$ C. and $125°$ C.

This requirement with relation to the constancy of temperature, in particular for thermal shock load, together with the requirement for the housing to be tight, including against high-pressure steam jet cleaning equipment, makes the whole housing suitable for the engine compartment. Watertight housings of this type, that can also withstand mechanical shocks, are usually made of diecast aluminum with pressure compensating pellet using PCB technology, or as hermetically sealed hybrids. The costs for enclosing the electronic systems in this way amount in many cases to some 30% of the overall costs.

The object of the invention is therefore to provide a tight housing of the type mentioned at the outset that is of simple design, permits simple production at low cost, and ensures dependable protection of the electronic systems.

SUMMARY OF THE INVENTION

The above object generally is attained according to the present invention by a housing containing electronic components for use in motor vehicles wherein: the electronic components are disposed on an electronic carrier, in particular a PCB, a film or a hybrid carrier; a metal plate is provided to accommodate the electronic carrier, with the area of the metal plate having a larger area than the electronic carrier in order to form an edge all around said electronic carrier; the surface of the electronic carrier provided with the electronic components is provided with a protective lacquer; as a protection against moisture, a flexible and watertight film is spanned over the array formed by the metal plate and the electronic carrier provided with the electronic components such that the film is connected to the all-round edge in an airtight and watertight fashion and is largely matched to the surface contours of the electronic components; and a housing cover is provided as a mechanical protection and forms the housing in conjunction with the metal plate.

The invention substantially consists of the electronic components mounted on the electronic carrier and provided with a protective lacquer being closed off by an airtight and flexible film, the latter being a thermoformed part largely matching the contours of the components. The flexibility of the film ensures that it matches the volume changes undergone by the sealed-in air volume over the temperature range at constant air pressure, so that the sealing points formed by the edge of the metal plate running all round the electronic carrier and connected in airtight and watertight fashion to the film are not subjected to strains sufficient to cause leaks.

Since this film, preferably of plastic, is not used for mechanical protection, but can only protect against moisture, a housing cover is provided that together with the metal plate forms the housing.

In accordance with an advantageous embodiment of the invention, an aluminum foil coated with plastic on both sides can be used as the film, affording additional advantages as regards screening against electromagnetic fields.

Furthermore, in another preferred embodiment of the invention the film can also be provided with impressions as found in barometric cells, to achieve better adjustment of the film to the volume of the air enclosed by the film as this volume changes in response to temperature changes.

The protective lacquer applied to the surfaces of the electronic components and of the electronic carrier prevent electrical interference due to condensation from the small volume of air enclosed by the film above these surfaces. In accordance with a further embodiment of the invention, a UV-hardening lacquer or a polyurethane lacquer can be provided as the protective coating.

Finally, the housing cover can be designed such that it clips onto the metal plate, thereby enabling a particularly simple assembly sequence. The housing cover can be preferably manufactured as a plastic injection molded part.

The invention is described and explained in the following on the basis of an embodiment in conjunction with the drawing

PREFERRED EMBODIMENT

Figure 1:
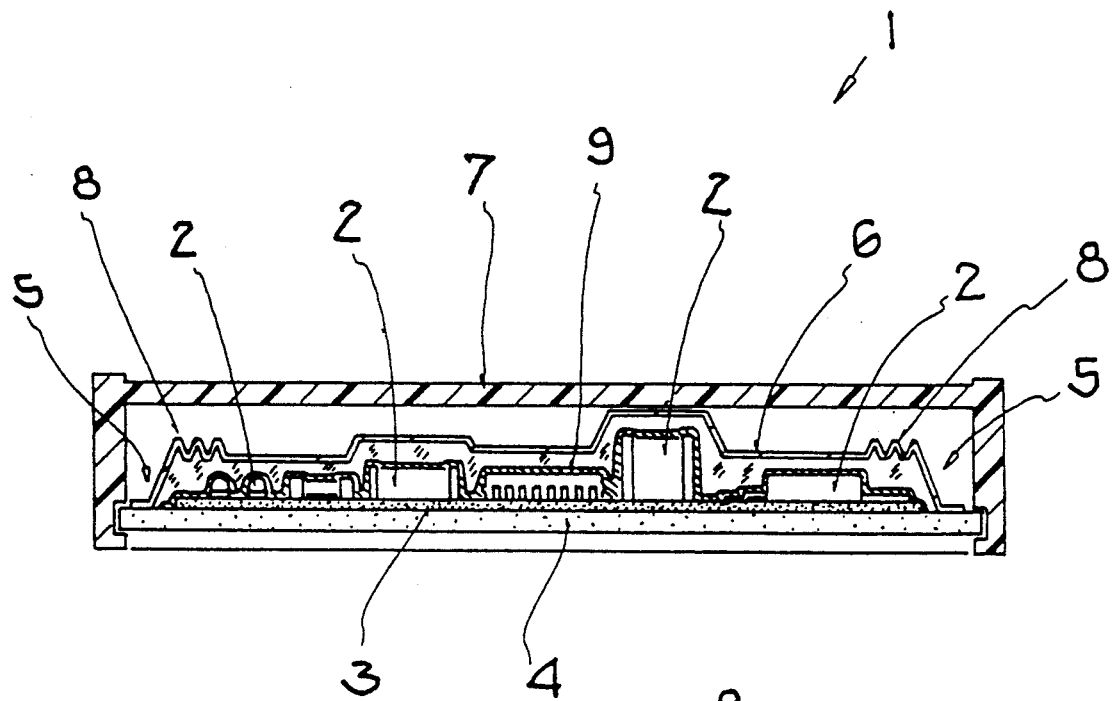
FIG. 1 is a cross-sectional view of an embodiment of the invention.
Figure 2:
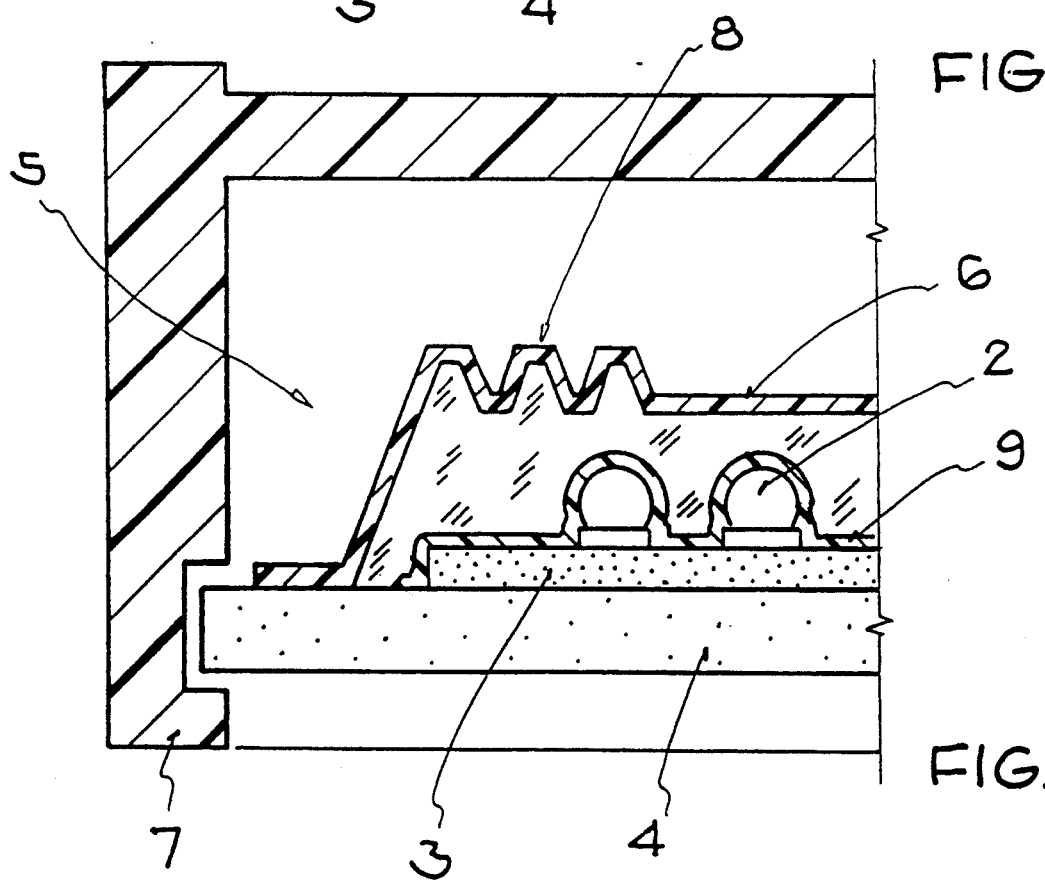
FIG. 2 is a partial enlarged view of the embodiment of FIG. 1.

The housing 1 according to FIGS. 1 and 2 comprises a metal plate 4, for example of aluminum, to which an electronic carrier or substrate in this case a PCB—carrying the electronic components 2 is affixed. This PCB 3 is therefore provided with these electronic components, which are of various heights and sizes. Furthermore, the area of this PCB 3 is smaller than that of the metal plate 4, so that an edge 5 is formed by this metal plate 4 all around the PCB 3. Before a film 6 is spanned over the array formed by the PCB 3 and the metal plate 4, said PCB 3 together with the electronic components 2 is provided with a protective lacquer 9, by means of which electrical interference due to condensation from the small volume of air enclosed the film 6 above these surfaces is prevented. The film 6, which is largely matched to the contour of the electronic components 2, is glued onto the all-round edge 5 of the metal plate 4 in an airtight and watertight fashion. This film 6, for example a plastic film of 50–150 μm thickness, is applied by a thermoforming process, with care being taken that the volume of air enclosed is kept as low as possible. Since the air volume enclosed by this film can undergo a volume change of up to 30% over the temperature range when the pressure is constant, the flexibility of this film 6 ensures that these volume changes can be matched by the film, as otherwise the increased air pressure could lead to leakage. Impressions 8 in the form of a barometric cell in this film 6 facilitate its volume change with low forces.

As an alternative to a plastic film 6, an aluminum foil coated with plastic on both sides can be used, affording additional advantages as regards screening against electromagnetic fields.

This film 6 represents an airtight but soft cover and provides protection against moisture. Mechanical protection of the array is assured by a hood-like cover 7 that is slipped over the PCB 3 and clipped onto the metal plate 4. This ensures a defined and technically acceptable external contour of the housing 1. This housing cover 7 can be produced inexpensively as a plastic injection molded part that can have screw fastening positions if necessary.

The design of this housing in accordance with the invention permits its assembly in a simple process on an automatic production line at low cost and ensures dependable protection of the electronics even in high temperature applications. High temperature applications of this type occur particularly when electronic assemblies have to be arranged directly on the engine block of a motor vehicle.

What is claimed is:

1. A housing containing electronic components for use in motor vehicles wherein:
   said electronic components are disposed on an electronic carrier which is one of a PCB, a film or a hybrid carrier;
   a metal plate is provided to accommodate said electronic carrier, with the are of said metal plate having a larger area than said electronic carrier in order to form an edge all round said electronic carrier;
   the surface of said electronic carrier provided with said electronic components is provided with a protective lacquer;
   as a protection against moisture, a flexible and watertight film is spanned over the array formed by said metal plate and said electronic carrier provided with said electronic components such that said film is connected to said all-round edge in an airtight and watertight fashion and is largely matched to the surface contours of said electronic components; and
   a housing cover is provided as a mechanical protection and forms said housing in conjunction with said metal plate.

2. A housing according to claim 1, wherein a plastic film is used as said film.

3. A housing according to claim 1, wherein a metal foil coated with plastic on both sides is used as said film.

4. A housing according to claim 3, wherein said metal foil is made of aluminum.

5. A housing according to claim 1, wherein said film impressions for better adjustment of said film to the volume of the air enclosed by said film as said volume changes in response to temperature changes.

6. A housing according to claim 1, wherein a UV-hardening lacquer is provided as the protective coating.

7. A housing according to claim 1, wherein a polyurethane lacquer is provided as the protective coating.

8. A housing according to claim 1, wherein said housing cover is designed such that it clips onto said metal plate.

9. A housing according to claim 8, wherein said housing cover is manufactured as a plastic injection molded part.

10. A housing containing electronic components for use in motor vehicles comprising:
    a carrier having a plurality of electronic components disposed on a surface of said carrier;
    a metal plate having an area of which is larger than that of said carrier, said carrier being disposed on a surface of said metal plate to form an edge area extending all around said carrier;
    a protective lacquer covering said surface of said carrier provided with said electronic components;
    a flexible and watertight film spanned over the array formed by said metal plate and said carrier provided with said electronic components and connected to said edge area all around said carrier in an airtight and watertight fashion, said film having a shape largely matched to the surface contours of said electronic components; and
    a housing cover, provided as a mechanical protection, extending over said film and connected to said metal plate to form the housing;

11. A housing according to claim 10, wherein said film is a plastic film.

12. A housing according to claim 10, wherein said film is a metal foil coated with plastic on both sides.

13. A housing according to claim 12, wherein said metal foil is made of aluminum.

14. A housing according to claim 10, wherein said film is provided with impressions to better enable adjustment of said film to the volume of the air enclosed by said film as said volume changes in response to temperature changes.

15. A housing according to claim 10, wherein said protective coating in a UV-hardening lacquer.

16. A housing according to claim 10, wherein said protective coating is a polyurethane lacquer.

17. A housing according to claim 10, wherein said housing cover includes means for clipping said cover onto the edge of said metal plate.

18. A housing according to claim 17, wherein said housing cover is a plastic injection molded part.

* * * * *